(12) United States Patent
Pamarti et al.

(10) Patent No.: US 12,188,896 B2
(45) Date of Patent: Jan. 7, 2025

(54) ADAPTIVE PROGRAMMABLE MODULATION TECHNIQUES FOR MINIATURIZED MEASUREMENT DEVICES

(71) Applicant: FemtoDx, Inc., Beverly Hills, CA (US)

(72) Inventors: Sudhakar Pamarti, Irvine, CA (US); Shyamsunder Erramilli, Quincy, MA (US); Pritiraj Mohanty, Beverly Hills, CA (US)

(73) Assignee: FemtoDx, Inc., Beverly Hills, CA (US)

( * ) Notice: Subject to any disclaimer, the term of this patent is extended or adjusted under 35 U.S.C. 154(b) by 127 days.

(21) Appl. No.: 17/776,754

(22) PCT Filed: Jan. 27, 2020

(86) PCT No.: PCT/US2020/015151
§ 371 (c)(1),
(2) Date: May 13, 2022

(87) PCT Pub. No.: WO2021/096546
PCT Pub. Date: May 20, 2021

(65) Prior Publication Data
US 2022/0397548 A1 Dec. 15, 2022

Related U.S. Application Data

(60) Provisional application No. 62/934,971, filed on Nov. 13, 2019.

(51) Int. Cl.
*G01N 27/41* (2006.01)
*G01N 27/04* (2006.01)
*G01N 27/414* (2006.01)

(52) U.S. Cl.
CPC ......... *G01N 27/4148* (2013.01); *G01N 27/04* (2013.01); *G01N 27/4146* (2013.01); *G01N 27/4145* (2013.01)

(58) Field of Classification Search
CPC ............... G01N 27/4148; G01N 27/04; G01N 27/4146; G01N 27/4145; G01R 1/30; G01R 27/02
See application file for complete search history.

(56) References Cited

U.S. PATENT DOCUMENTS

| | | | | |
|---|---|---|---|---|
| 5,305,004 A | * | 4/1994 | Fattaruso | H03M 1/1061 341/120 |
| 5,444,641 A | * | 8/1995 | White | G01R 29/22 702/65 |

(Continued)

*Primary Examiner* — Alvaro E Fortich
(74) *Attorney, Agent, or Firm* — Wolf, Greenfield & Sacks, P.C.

(57) ABSTRACT

Aspects of the present disclosure provide measurement devices and methods for detecting electrical characteristics of devices under test (DUTs), such as semiconductor nanowires. Techniques described herein provide programmable measurement devices that may be implemented in a compact form factor while being able to perform reliable measurements. In some embodiments, measurement devices described herein may be programmed to modulate signals for transmitting to a DUT, and may demodulate signals from the DUTs adaptively using self-programming techniques described herein. Such self-programming may include applying a programmable phase delay to oscillator signals used during demodulation. In some embodiments, such measurement devices may be implemented on a single circuit board, in a single integrated circuit package, or even on a single solid-state semiconductor die. Techniques described herein may enable reliable, inexpensive, and small-scale fluid sample measurement devices.

6 Claims, 13 Drawing Sheets

(56) References Cited

U.S. PATENT DOCUMENTS

| | | | |
|---|---|---|---|
| 2002/0102951 A1* | 8/2002 | Nakano | H03D 7/00 455/120 |
| 2006/0138575 A1* | 6/2006 | Kamins | G01N 27/127 257/419 |
| 2010/0052666 A1* | 3/2010 | Lenglet | G01V 3/08 324/228 |

* cited by examiner

ADAPTIVE PROGRAMMABLE MODULATION TECHNIQUES FOR MINIATURIZED MEASUREMENT DEVICES

RELATED APPLICATIONS

This Application is a national stage filing under 35 U.S.C. § 371 of International Application No. PCT/US2020/015151, filed Jan. 27, 2020, and entitled "ADAPTIVE PROGRAMMABLE MODULATION TECHNIQUES FOR MINIATURIZED MEASUREMENT DEVICES," which claims priority under 35 U.S.C. § 119 (e) to U.S. Provisional Application Ser. No. 62/934,971, filed Nov. 13, 2019 and entitled "ADAPTIVE PROGRAMMABLE MODULATION TECHNIQUES FOR MINIATURIZED MEASUREMENT DEVICES," each of which is hereby incorporated by reference in its entirety.

FIELD

The techniques described herein relate generally to methods and apparatus for nanochannel-based sensors used to sense chemical or biological species, and in particular to adaptive programmable modulation techniques for miniaturized measurement devices.

BACKGROUND OF INVENTION

Chemical or biological sensors can include nanowires and/or other small-scale electrical devices that essentially serve as sensitive transducers that convert chemical activity of interest into corresponding electrical signals that can be used to accurately represent the chemical activity. The nanosensors can include one or more nanowires (e.g., which may have a tubular form). The nanowires can be fabricated such that once functionalized, their surface will interact with adjacent molecular entities, such as chemical species. The interaction of the nanowires with molecular entities can induce a change in a property (such as conductance) of the nanowire.

BRIEF SUMMARY OF INVENTION

For many sensing applications, it can be beneficial to employ sensors having high sensitivity to a species of interest. Sensors with high sensitivity can be used to detect much smaller amounts or concentrations of the species, which may be necessary or desirable in some applications, and/or such sensors can provide a high signal-to-noise ratio and thus improve the quality of measurements that are taken using the sensor.

Some embodiments relate to a measurement device including an integrated circuit package containing a programmable phase delay unit configured to apply a pre-programmed phase delay to an oscillator signal to generate a delayed oscillator signal, and demodulation circuitry configured to extract a component of a received signal using the delayed oscillator signal.

In some examples, the demodulation circuitry is configured to mix the delayed oscillator signal with the received signal to generate a baseband signal including the component of the received signal.

In some examples, the component of the received signal includes at least 75% of power contained in the received signal.

In some examples, the component of the received signal includes at least 90% of power contained in the received signal.

In some examples, the integrated circuit package further contains a local oscillator configured to generate the oscillator signal, and modulation circuitry configured to generate a modulated transmit signal using the oscillator signal.

In some examples, the modulation circuitry is configured to generate the modulated transmit signal by mixing a transmit signal with the oscillator signal.

In some examples, the modulation circuitry is configured to output the modulated transmit signal as a square wave oscillating between two direct current (DC) voltage levels.

In some examples, the modulation circuitry includes a butterfly switch.

In some examples, the integrated circuit package further contains amplification circuitry configured to amplify the received signal to generate an amplified received signal, and the demodulation circuitry is configured to extract the component from the amplified received signal.

In some examples, the integrated circuit package further contains an analog-to-digital converter (ADC) configured to digitize the amplified received signal to generate a digital received signal, and the demodulation circuitry is configured to extract the component from the digital received signal.

In some examples, the system further comprises at least one semiconductor nanowire electrically coupled to the demodulation circuitry, wherein the received signal indicates an electrical characteristic of the at least one semiconductor nanowire.

In some examples, the system further comprises programming circuitry configured to reprogram the pre-programmed phase delay based on the component extracted by the demodulation circuitry.

Some embodiments relate to a method of programming a measurement device. The method includes demodulating a first received signal from a device-under-test (DUT) using a first delayed version of an oscillator signal, generating a second delayed version of the oscillator signal based on demodulating the first received signal, and demodulating a second received signal from the DUT using the second delayed version of the oscillator signal.

In some examples, the DUT includes at least one semiconductor nanowire.

In some examples, demodulating the first received signal includes mixing the first received signal with the first delayed version of the oscillator signal to generate a first baseband signal, and generating the second delayed version of the oscillator signal includes determining a second delay based on the first baseband signal.

In some examples, generating the second delayed version of the oscillator signal further includes programming the second delay into a programmable delay unit, and applying, by the programmable delay unit, the second delay to the oscillator signal.

In some examples, the method includes, prior to demodulating the first received signal, demodulating a third received signal using a third delayed version of the oscillator signal to generate a second baseband signal, wherein determining the second delay includes determining whether the first baseband signal has a greater signal power than the second baseband signal.

In some examples, the method includes modulating a transmit signal using the oscillator signal to generate a modulated transmit signal, and transmitting the modulated transmit signal to the semiconductor nanowire.

Some embodiments relate to a measurement device. The measurement device includes demodulation circuitry configured to use an oscillator signal to extract a component of a received signal from at least one semiconductor nanowire, wherein the component is in-phase with the oscillator signal, and processing circuitry configured to detect an electrical characteristic of the at least one semiconductor nanowire using the component.

In some examples, the electrical characteristic includes a conductance of the at least one semiconductor nanowire.

In some examples, the at least one semiconductor nanowire includes first and second semiconductor nanowires, and the electrical characteristic includes a difference between a first conductance of the first semiconductor nanowire and a second conductance of the second semiconductor nanowire.

In some examples, the first conductance is based at least in part on biological phenomena proximate the first semiconductor nanowire, and the difference between the first conductance and the second conductance indicates a presence or absence of the biological phenomena.

In some examples, the biological phenomena proximate the first semiconductor nanowire includes one or more analytes bound to an exterior surface of the first semiconductor nanowire.

In some examples, the one or more analytes are bound to the exterior surface by one or more detectors that are bound to the exterior surface.

In some examples, the demodulation circuitry is configured to mix the received signal with a delayed version of an oscillator signal to obtain a baseband signal indicating the electrical characteristic of the at least one semiconductor nanowire.

In some examples, the measurement device further includes modulation circuitry configured to mix the oscillator signal with a transmit signal to generate a modulated transmit signal.

In some examples, the measurement device further includes amplification circuitry configured to amplify the received signal to generate an amplified received signal, and an analog-to-digital converter (ADC) configured to digitize the amplified received signal to generate a digital received signal, wherein the demodulation circuitry is configured to extract the component of the digital received signal.

BRIEF DESCRIPTION OF THE DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Sensors (e.g., nanochannel-based sensors) can be used to detect an analyte in a liquid. The concentration of the analyte can be determined based on various measurements. The inventors have discovered and appreciated that while traditional lock-in amplification techniques can be used with sensors (e.g., nanochannel-based sensors), it can result in a number of drawbacks and/or deficiencies, such as a high cost implementations, large size (e.g., since lock-in amplifiers are usually large bench-top devices), and/or computationally expensive calculations. The inventors have developed improvements to existing sensing (e.g., nanochannel-based sensing) technologies that can be used in lieu of traditional lock-in amplification techniques. The techniques provide programmable measurement devices that may be implemented in a compact form factor while being able to perform reliable measurements. In some embodiments, measurement devices described herein may be programmed to modulate signals for transmitting to one or more devices under test (DUTs), such as semiconductor nanowires, and may demodulate signals from the DUTs adaptively using self-programming techniques (e.g., which may include applying a programmable phase delay to oscillator signals used during demodulation). In some embodiments, such measurement devices may be implemented on a single circuit board, in a single integrated circuit package, or even on a single solid-state semiconductor die. Techniques described herein may enable reliable, inexpensive, and small-scale fluid sample measurement devices.

Figure 1:
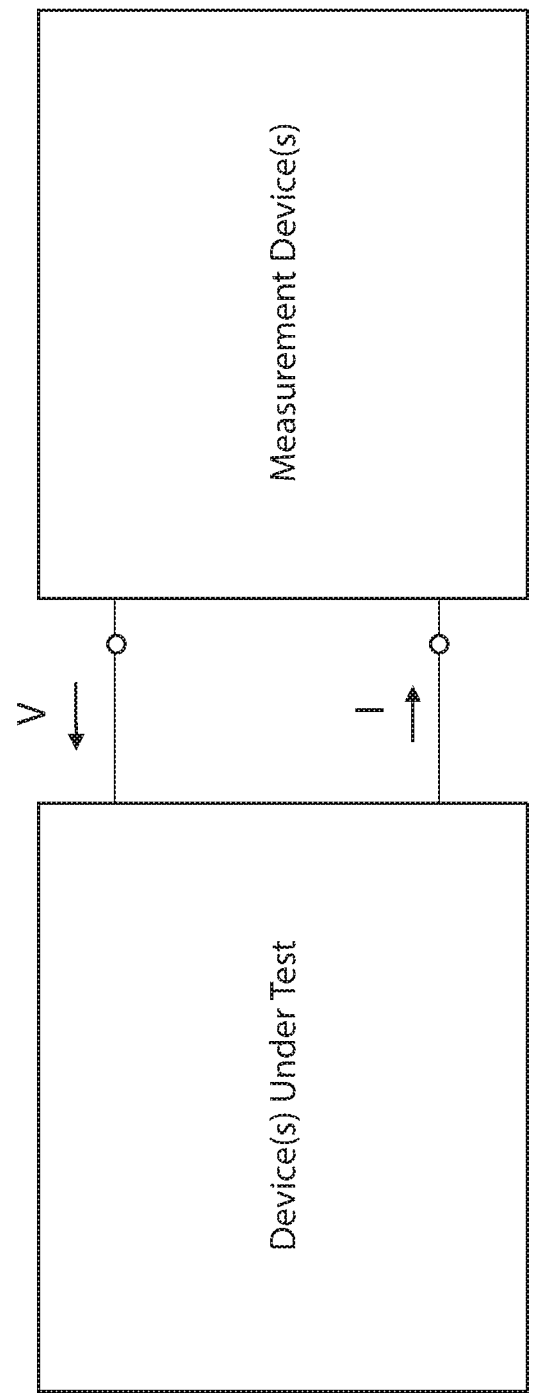
FIG. 1 is a block diagram of an exemplary measurement system including a measurement device and a device-under-test (DUT), in accordance with some embodiments of the technology described herein.

FIG. 1 is a block diagram of an exemplary measurement system including a measurement device and at least one device-under-test (DUT), in accordance with some embodiments of the technology described herein. In some embodiments, the measurement device may be configured to detect electrical characteristics of the DUT(s). In some embodiments, the DUT(s) may include one or more semiconductor nanowires. For example, the measurement device may be configured to detect an impedance or conductance of the nanowire(s), with the impedance or conductance indicating the presence (or absence) of biological phenomena proximate the nanowire(s). In some embodiments, the measurement device may detect the electrical characteristics by transmitting a signal to the DUT(s) and receiving a signal from the DUT(s). As illustrated in FIG. 1, the transmit signal may include a voltage and the receive signal may include a current generated due to the voltage of the transmit signal.

It should be appreciated that techniques described herein may be applied using non-electrical sensors such as optical or image sensors. For example, the measurement device of FIG. 1 may be alternatively or additionally configured to detect optical or electrical characteristics of the DUT(s) by transmitting and receiving one or more optical signals.

Figure 2A:
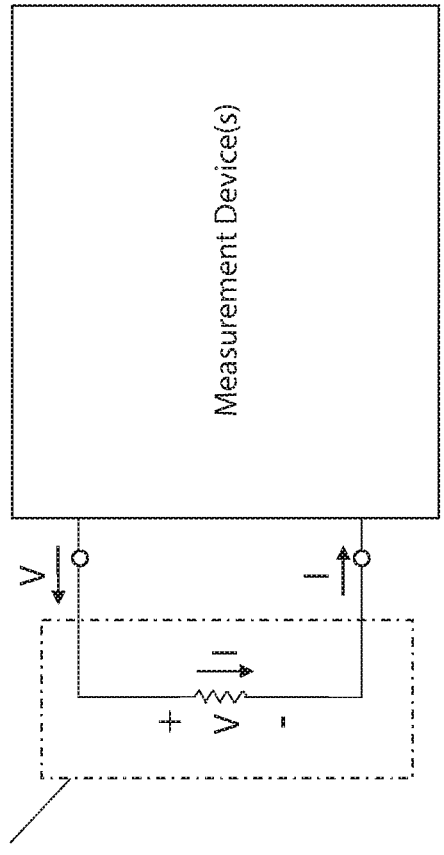
FIG. 2A illustrates an exemplary measurement system including a measurement device and a resistor as a DUT, in accordance with some embodiments of the technology described herein.

In some embodiments, the DUT(s) may include a resistor, as illustrated in the example of FIG. 2A. The measurement device is coupled to the resistor at a pair of terminals. The measurement device provides a transmit signal at the terminals including a voltage. As a result of the voltage applied at the terminals, a current I flows through the resistor and may be detected by the measurement device. It should be appreciated that the resistor illustrated in FIG. 2A may represent other DUTs that may be modeled as a resistor (or complex resistor). One such example is a resonator (e.g., an LC resonator) having a frequency-dependent impedance. Another such example is an active device having a constant impedance when certain circuit parameters are set (e.g., a constant-biased transistor). In each case, an impedance or conductance may be detected by applying a voltage and detecting a current generated in response. It should be further appreciated that some embodiments may provide a constant current at the terminals of the measurement device to flow through the resistor and the electrical characteristics may be detected in a voltage at the terminals generated by the current. Further, the DUT(s) in some embodiments may include multiple resistors coupled in parallel between the terminals.

Figure 2B:
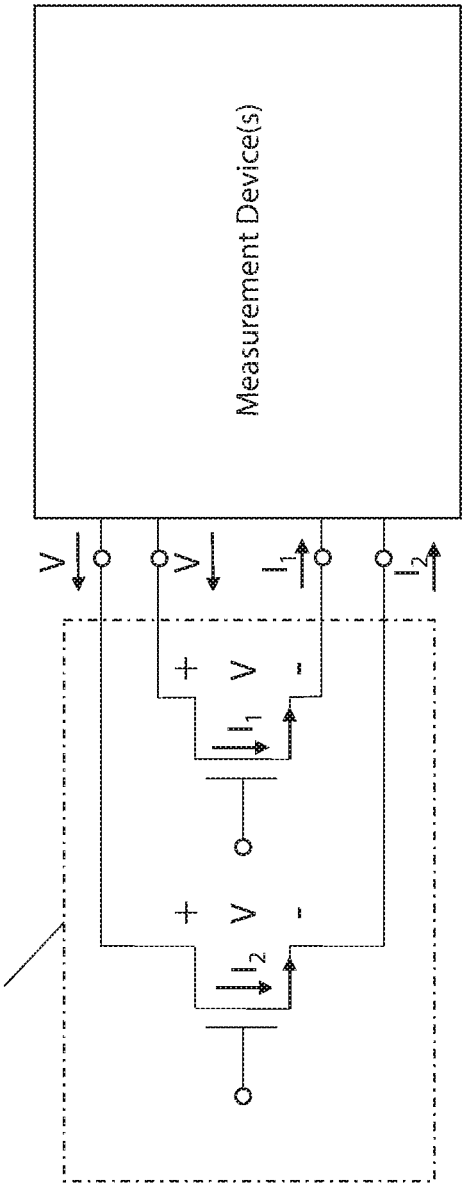
FIG. 2B illustrates an exemplary measurement system including a differential measurement device and two transistors as DUTs, in accordance with some embodiments of the technology described herein.

In some embodiments, the DUT(s) may include one or more field effect transistors (FETs), as illustrated in the example of FIG. 2B. The measurement device of FIG. 2B includes two pairs of terminals, each pair coupled to respective sources and drains of the FETs. The measurement device may apply voltages V across the sources and drains of the FETs and detect a current indicating electrical characteristics of the FETs, such as an impedance or conductance. The electrical characteristics may indicate a voltage at the gates of the FETs. In some embodiments, the measurement device may transmit a same signal (e.g., a same voltage V) to both FETs, and the measurement device may receive different signals (e.g., different currents I) from the FETs. In such embodiments, the measurement device may be configured to detect a difference between the received signals to determine a difference between the electrical characteristics of the FETs.

Figure 3:
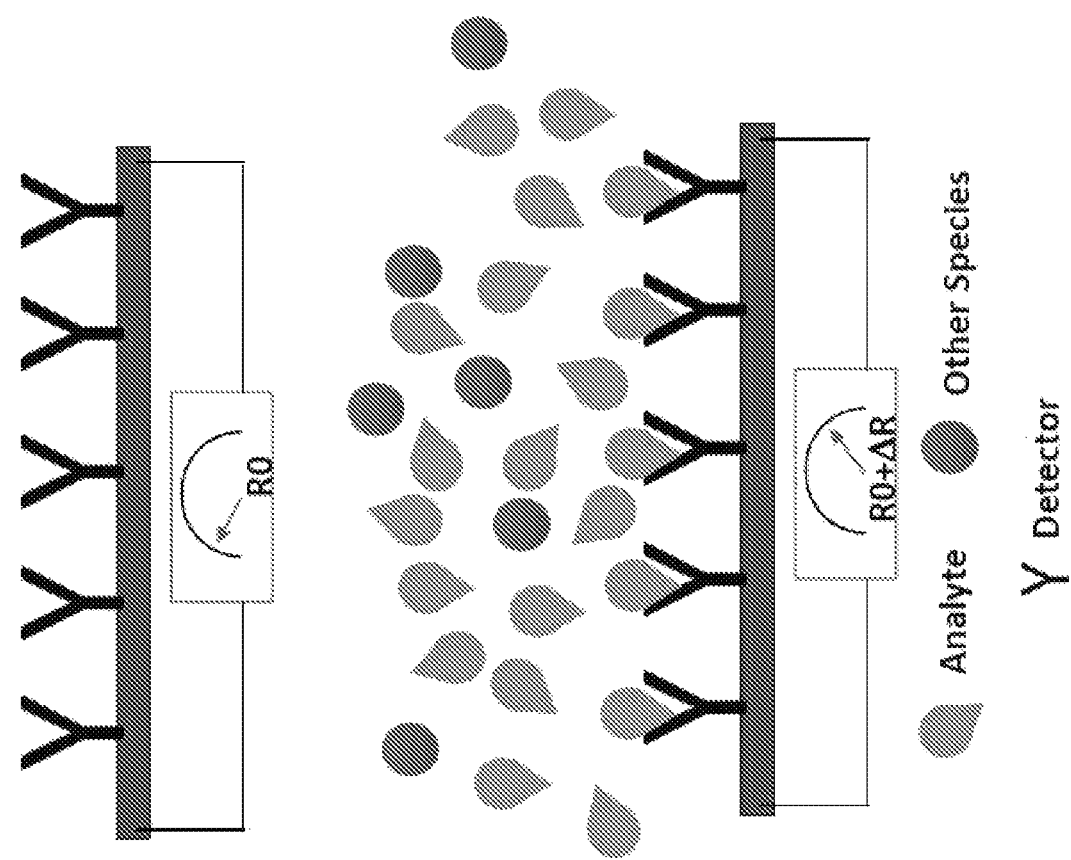
FIG. 3 illustrates detection of exemplary biological phenomena using a measurement device and one or more DUT(s), in accordance with some embodiments of the technology described herein.

Although the gates of the FETs are shown in an open-circuit configuration in FIG. 2B, the gates may be coupled to voltages that vary over time. In one example, the FETs may represent semiconductor nanowires proximate biological phenomena, with the gates of the FETs representing portions of the nanowires that are exposed to the biological phenomena, such the nature of the biological phenomena causes particular voltages to appear at the gates. In some embodiments, such as illustrated in FIG. 3, the nanowires may be exposed to analytes that can bind to exterior surfaces of the nanowires. In one example, the analytes may bind to a plurality of detectors that are in-turn bound (or functionalized) to the exterior surfaces of the nanowires. In some embodiments, one of the gates (e.g., nanowires) may be exposed to biological phenomena (e.g., analytes), and the other gate may not be exposed to the biological phenomena, or may be exposed to biological phenomena of a different nature, such that a difference between the gate voltages may indicate the nature of the phenomena to which the gates are exposed. In such embodiments, a difference between the electrical characteristics (e.g., $\Delta R$ in FIG. 3) detected from the FETs may indicate the nature of the biological phenomena. Suitable sensors (e.g., including semiconductor nanowires) and sensing technologies have been described in commonly-owned International Publication Number WO 2016/089,453 and U.S. Pat. No. 10,378,044, both of which are incorporated herein by reference in their entireties.

It should be appreciated that some embodiments may include more than two FETs. In addition, differential measurement as described for the two FETs may be performed for other DUTs, such as resistors, complex impedances, and other such DUTs.

Figure 4A:
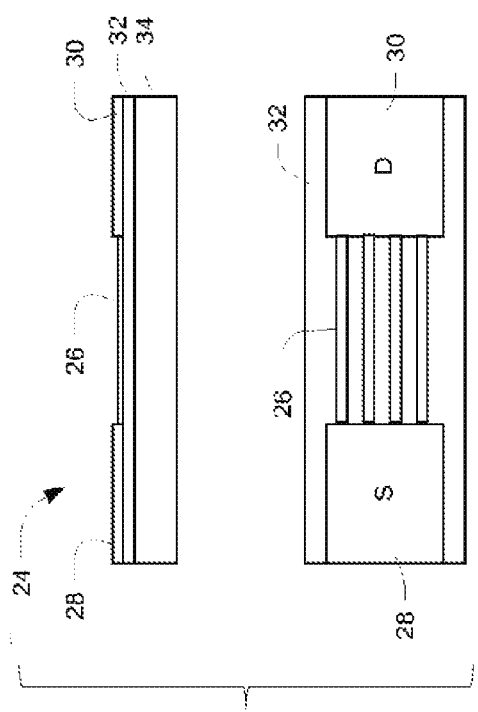
FIG. 4A illustrates an exemplary DUT that includes a semiconductor nanowire, in accordance with some embodiments of the technology described herein.

FIG. 4A illustrates an exemplary DUT that includes semiconductor nanowires, in accordance with some embodiments of the technology described herein. In accordance with various embodiments, the semiconductor nanowires illustrated in FIG. 4A may be formed using Silicon, Germanium, and/or a III-V semiconductor material.

Referring to the FETs illustrated in FIG. 2B, the source and drain of the illustrated nanowires may correspond to the source and drain of one of the FETs. The portions elongated between the source and drain may correspond to the gate of one of the FETs. For example, when the measurement device transmits a signal to apply a voltage V at the source and drain of the nanowire, a current/may flow through the nanowires from the source to the drain, such that the measurement device may detect electrical characteristics of the nanowires. However, the portions of the nanowires disposed between the source and drain may have a variable conductance that depends on an electric field proximate the nanowires, which may be impacted by biological phenomena in the surroundings of the nanowires. For example, the presence or absence of analytes proximate the nanowires may change the electrical field proximate the nanowires. Accordingly, the conductance of the nanowires may change depending on the presence or absence of analytes, which may be indicated in the detected current I.

Figure 4B:
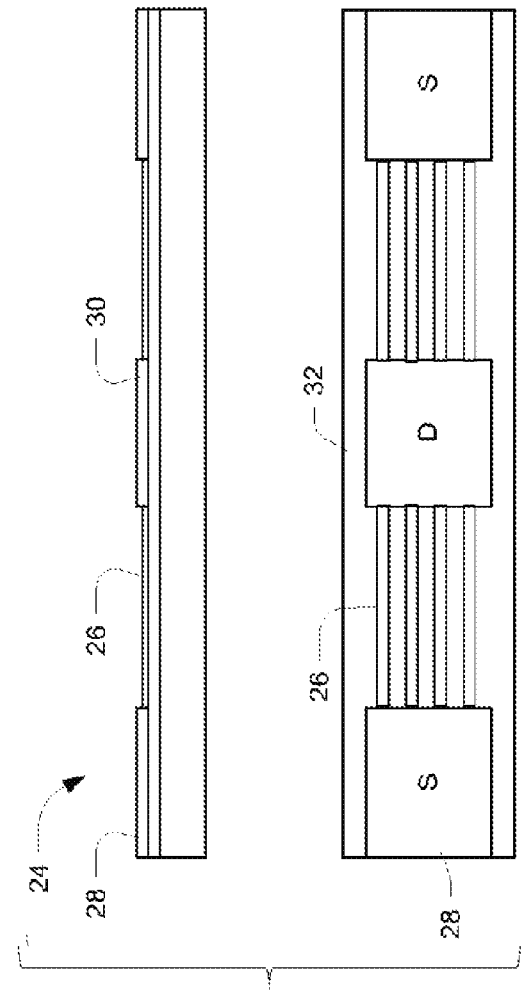
FIG. 4B illustrates an exemplary DUT that includes a semiconductor nanowire configured for differential measurement, in accordance with some embodiments of the technology described herein.

In another example, the FETs illustrated in FIG. 2B may represent portions of a single silicon nanowire structure, as illustrated in FIG. 4B. The semiconductor nanowires of FIG. 3B may be formed using the same techniques as the nanowires of FIG. 3A, such as using the same materials. However, the nanowires of FIG. 4B include a single drain and multiple sources. According to the example of FIG. 2B, the measurement device may transmit a signal (e.g., voltage V) to the drain of the nanowires illustrated in FIG. 4B, and currents $I_1$ and $I_2$ may flow from the drain to respective sources of the nanowires. The currents $I_1$ and $I_2$ may depend on electrical characteristics of the portions of the nanowires disposed between the drain and the two sources. Referring to the above example, one of the nanowire portions may be exposed to different biological phenomena (analytes) than the other nanowire portions, resulting in different electrical characteristics (e.g., conductance) of the nanowire portions. Accordingly, the currents $I_1$ and $I_2$ may indicate the different electrical characteristics to the measurement device.

Figure 5:
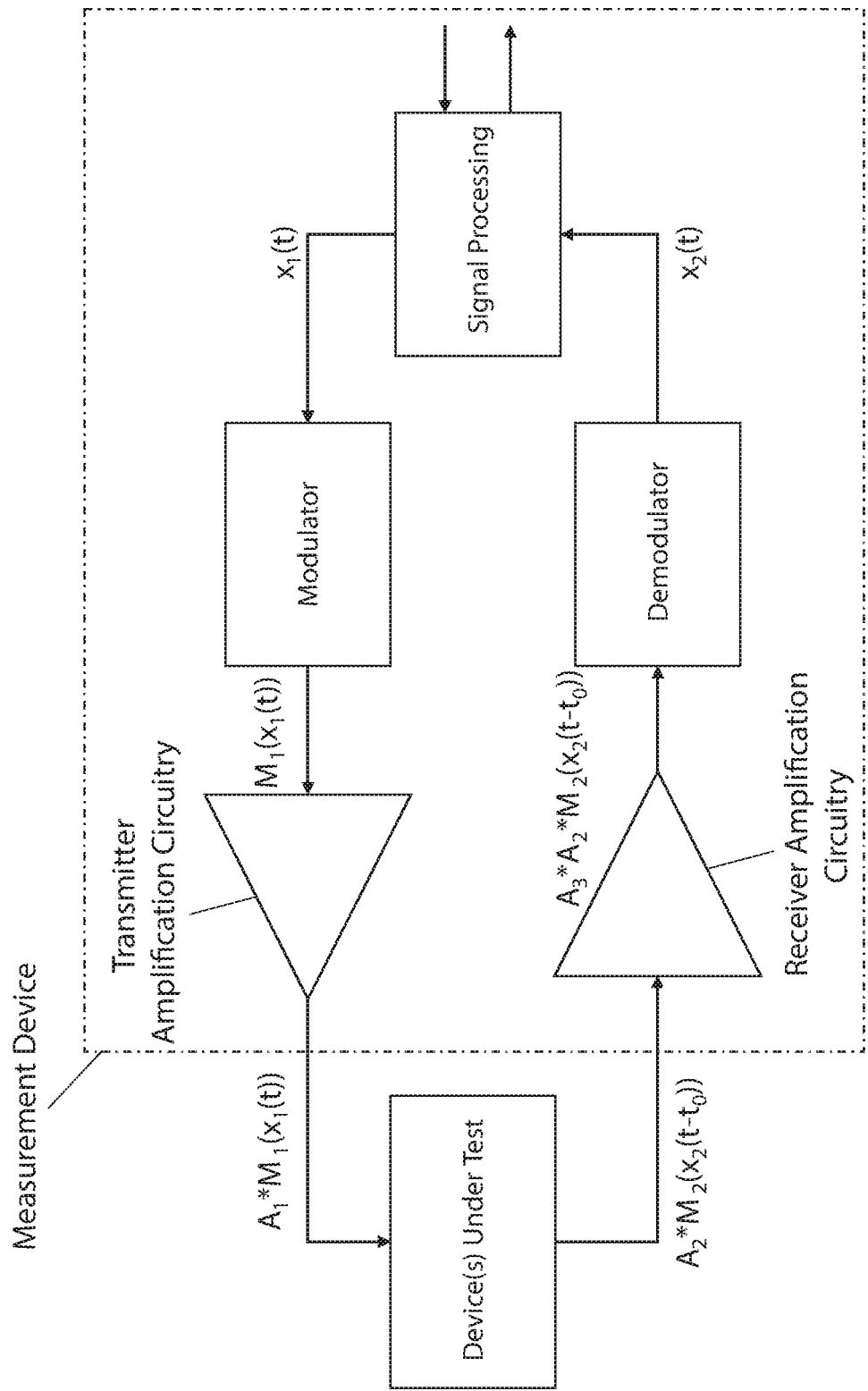
FIG. 5 is a block diagram illustrating components of an exemplary measurement device, in accordance with some embodiments of the technology described herein.

Measurement devices described herein, such as illustrated in FIG. 1, may be configured to generate and transmit signals to DUTs and receive signals indicating electrical characteristics of the DUTs. FIG. 5 is a block diagram illustrating components of an exemplary measurement device, in accordance with some embodiments of the technology described herein. As illustrated in FIG. 5, the measurement device may have transmit circuitry, including modulation circuitry and amplification circuitry, and receive circuitry, including amplification circuitry and demodulation circuitry. The measurement device may further include signal processing circuitry configured to detect the electrical characteristics indicated in signals received by the measurement device. In some embodiments, the measurement device illustrated in FIG. 5 may be disposed on a single circuit board (e.g., PCB). In some embodiments, the measurement device may be contained in a single integrated circuit package. In some embodiments, the measurement device may be formed on a single semiconductor die.

Figure 6:
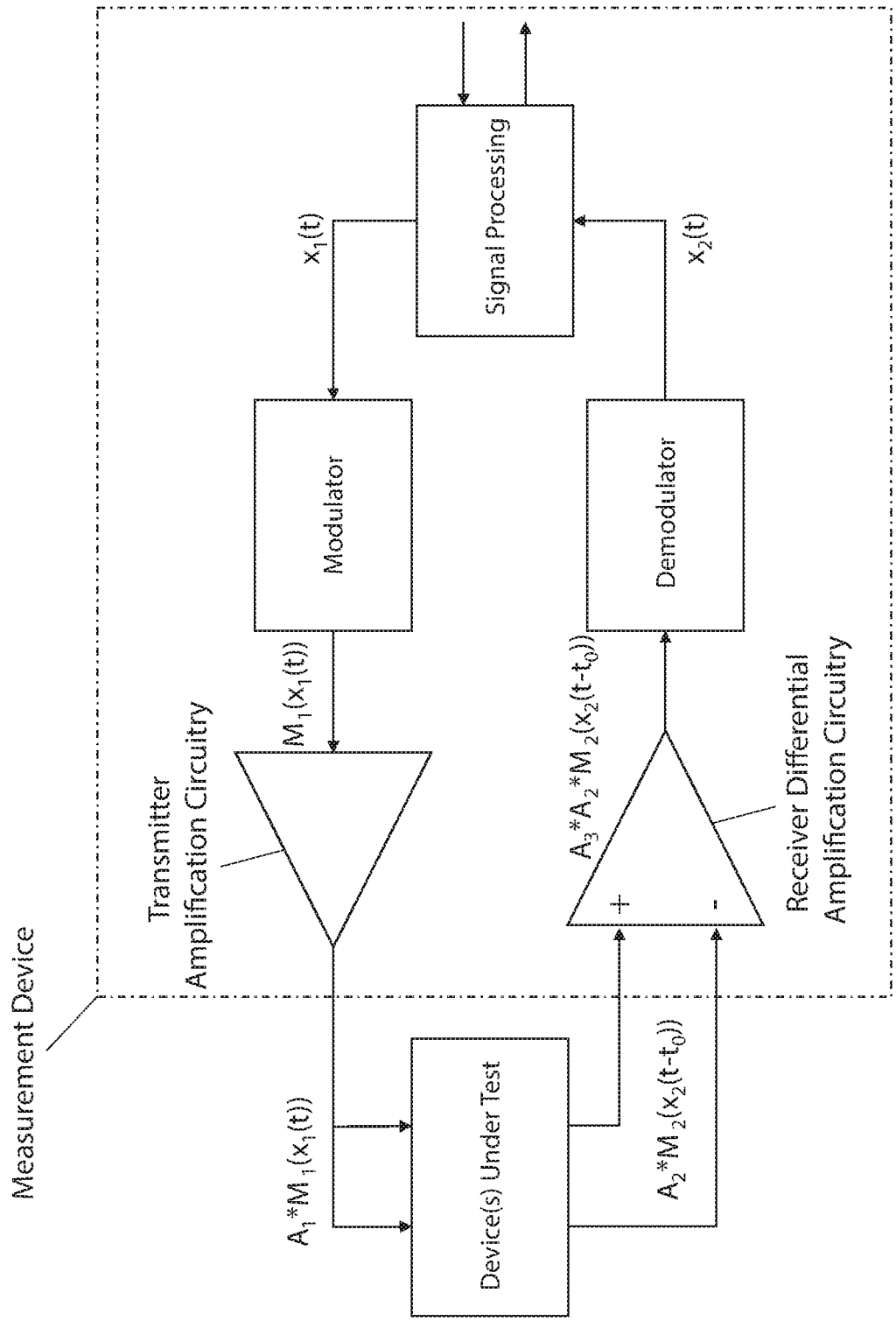
FIG. 6 is a block diagram illustrating components of an exemplary differential measurement device, in accordance with some embodiments of the technology described herein.

In some embodiments, measurement devices described herein may be configured to perform differential measurements, such as illustrated in FIG. 6. The measurement device of FIG. 6 includes transmit and receive circuitry, and the receive circuitry of FIG. 6 is further configured to receive two signals having electrical characteristics of the DUTs indicated in a difference between the two signals (e.g., a difference in current $I_1$-$I_2$). Accordingly, the receive circuitry includes differential amplifier circuitry configured to generate a signal based on the difference between the two received signals. In some embodiments, the measurement device may be configured to provide different transmit signals to the DUTs.

Figure 7:
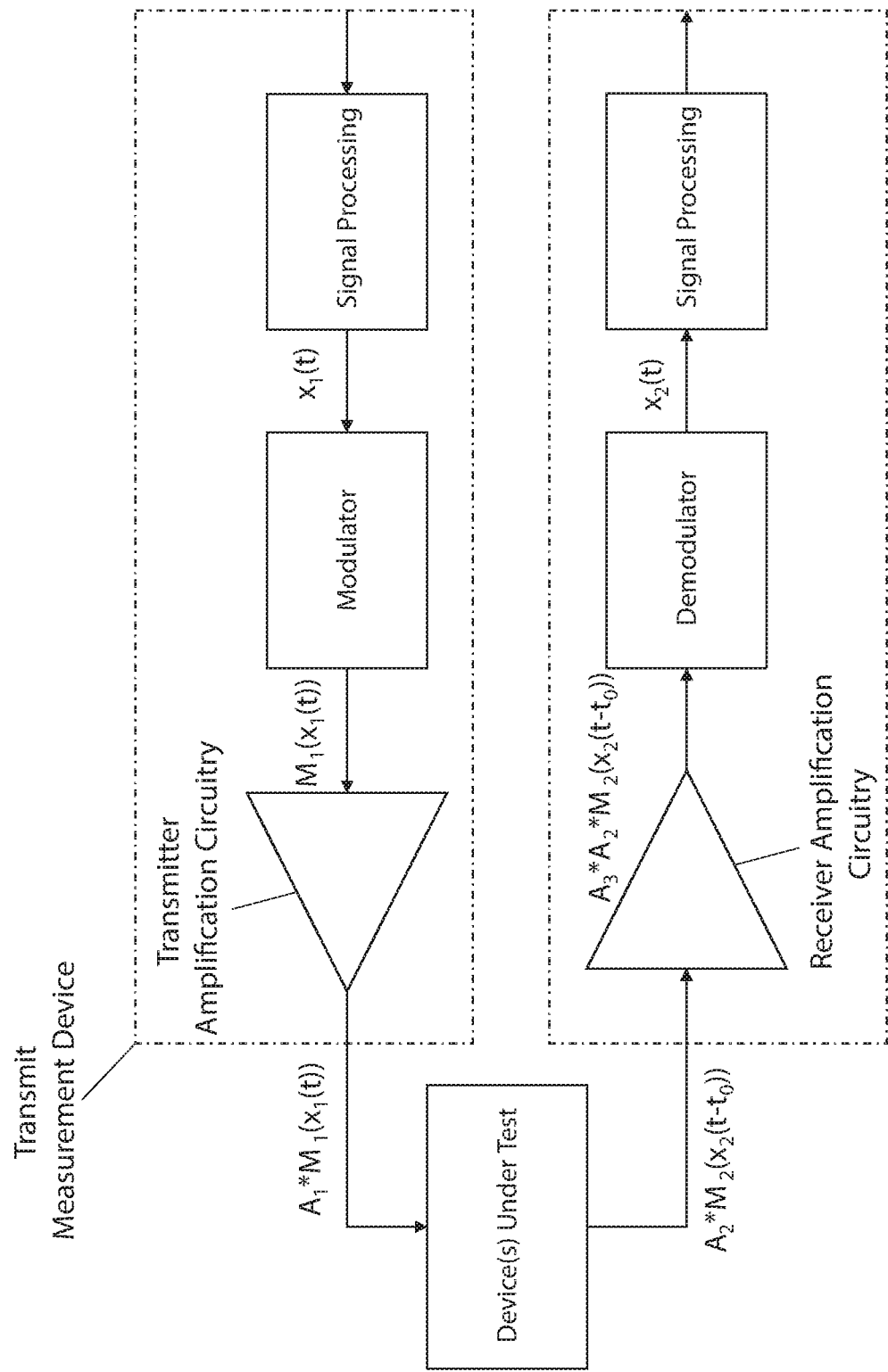
FIG. 7 is a block diagram illustrating exemplary transmit and receive measurement devices, in accordance with some embodiments of the technology described herein.

It should be appreciated that, in some embodiments, the transmit and receive circuitry may be included in separate measurement devices, as illustrated in the example of FIG. 7. The transmit and receive circuitry of FIG. 7 may be configured in the manner described in connection with FIG. 5, and/or may be configured for differential measurement as described in connection with FIG. 6.

Figure 8:
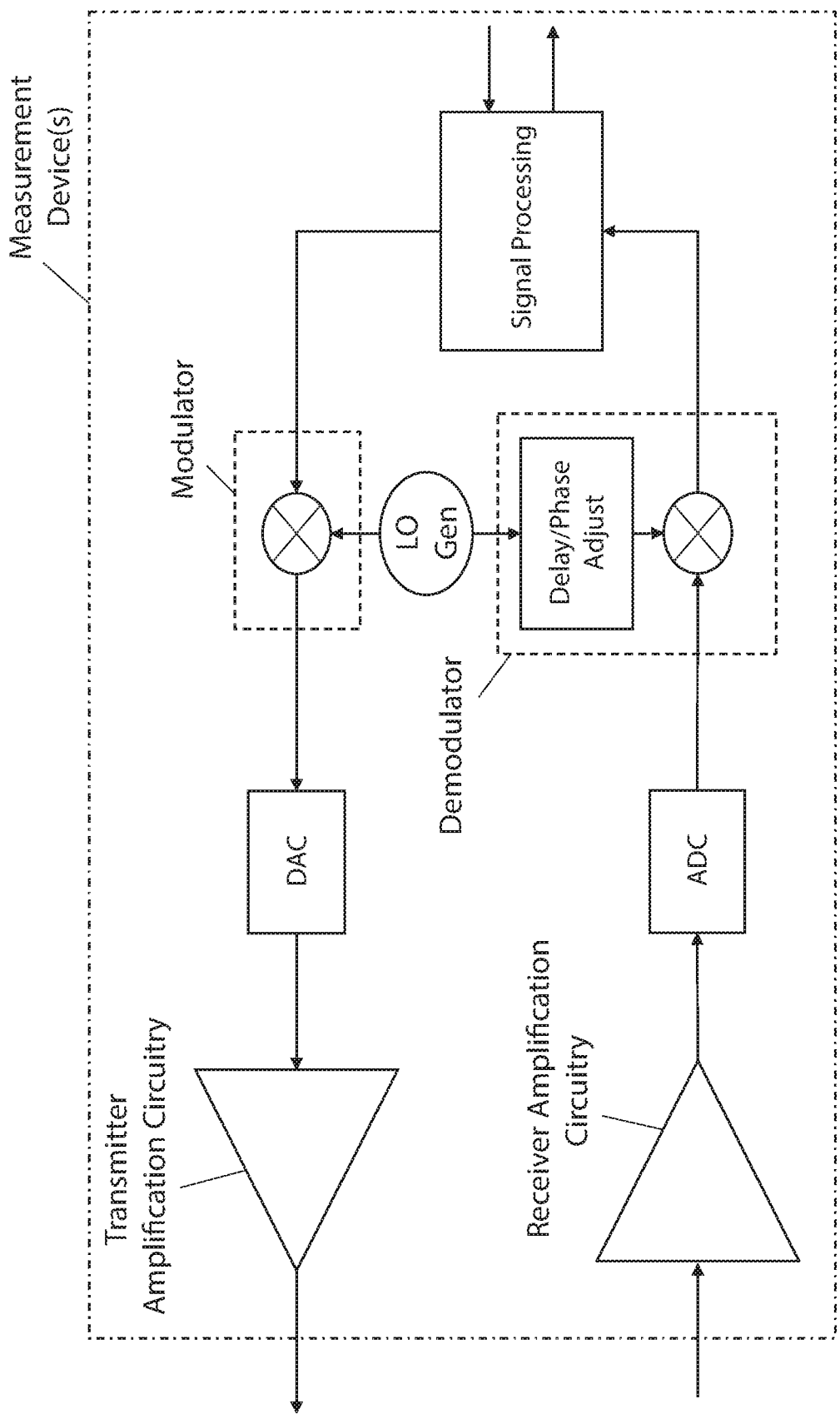
FIG. 8 is a circuit diagram illustrating exemplary components of a measurement device, in accordance with some embodiments of the technology described herein.

FIG. 8 is a circuit diagram illustrating exemplary transmit and receive circuitry of a measurement device, in accordance with some embodiments of the technology described herein. It should be appreciated that, in some embodiments, the measurement devices of FIGS. 1, 2A-2B, and 5-7 may include components illustrated in FIG. 8. The transmit circuitry of the measurement device of FIG. 8 includes modulation circuitry, a digital to analog converter (DAC), and amplification circuitry. However, it should be appreciated that the DAC and/or amplification circuitry may not be included in some embodiments, as described further herein. The receive circuitry of the measurement device includes amplification circuitry, an analog to digital converter (ADC), and demodulation circuitry. The measurement device also includes signal processing circuitry for detecting electrical characteristics of one or more DUTs using signals received from the DUT(s).

In some embodiments, the modulator may be configured to up-convert a baseband signal received from the signal processing circuitry to an appropriate measurement frequency. The up-conversion may be performed in the digital domain using multiplication by a digital carrier signal. In some examples, the modulation circuitry may be configured to use on-off modulation or a variant thereof to switch the baseband signal on or off in accordance with the carrier signal, which may be a square wave operating at the desired measurement frequency. In some embodiments described further herein, the square wave carrier signal may switch the baseband signal between two direct current (DC) voltage levels. The up-converted signal may be converted to the analog domain by the DAC for amplification by the amplification circuitry. In some embodiments, the up-converted signal in its digital form may be appropriate for transmission (e.g., having high enough frequency and large enough amplitude), and so the DAC and/or amplification circuitry may not be included. In some embodiments, the baseband signal may be converted to the analog domain using the DAC, and up-conversion may be performed on the analog baseband signal using a radio-frequency (RF) mixer and a carrier signal provided by a local oscillator (LO). When included, the transmit amplification circuitry may include one or more power amplifiers. In some embodiments, the output(s) of the amplification circuitry may be coupled to the DUT(s).

In some embodiments, the receive amplification circuitry may include one or more low-noise amplifiers (LNAs). The amplification circuitry may further include one or more trans-impedance amplifiers (TIAs) configured to convert current signals received from the DUT(s) into corresponding voltage signals. The TIA(s) may provide the voltage signals to the LNA(s) to generate amplified signals for digitizing, demodulating, and processing. In embodiments configured for differential measurement, the amplification circuitry may be configured to generate amplified signals indicating a difference between the received signals. For example, the measurement device may receive two different current signals, and the current signals may be converted into corresponding voltages by respective TIAs included in the amplification circuitry. The TIAs may provide the voltage signals to the LNAs for generating differential signals.

Following the amplification circuitry, received signals may be converted to the digital domain by the one or more ADCs. For example, demodulation may be performed in the digital domain by multiplying the received signals by a digital carrier signal (e.g., a delayed version of the carrier signal used to modulate the transmit signal) such that the demodulated signals are baseband signals that may be provided to the signal processing circuitry. As illustrated, a same oscillator signal is used in both modulation and demodulation, with a phase delay adjustment made to the oscillator signal for use in demodulation. In other examples, demodulation may be performed in the analog domain using an RF mixer and an LO signal (e.g., a delayed version of the LO signal used in modulation), after which the demodulated signals may be digitized using the ADC(s). The signal processing circuitry may detect electrical characteristics indicated in the received signals using the demodulated signals. It should be appreciated that different oscillators may be used for modulating and demodulating transmit and receive signals, including but not limited to an example in which separate transmit and receive devices are employed.

In some embodiments, measurement device components configured for operation in the digital domain (e.g., modulation circuitry, demodulation circuitry, signal processing circuitry, oscillator circuitry, etc.) may be formed using combinational logic gates as part of one or more field programmable gate array (FPGAs) and/or application specific integrated circuits (ASICs).

It should be appreciated that, for measurement devices described herein adapted to transmit and/or receive optical signals, modulation and demodulation circuitry and techniques described herein may be adapted for modulating and demodulating the optical signals accordingly. In some embodiments, the optical signals may be converted to or from electrical signals and modulated or demodulated in accordance with techniques described herein.

Figure 9:
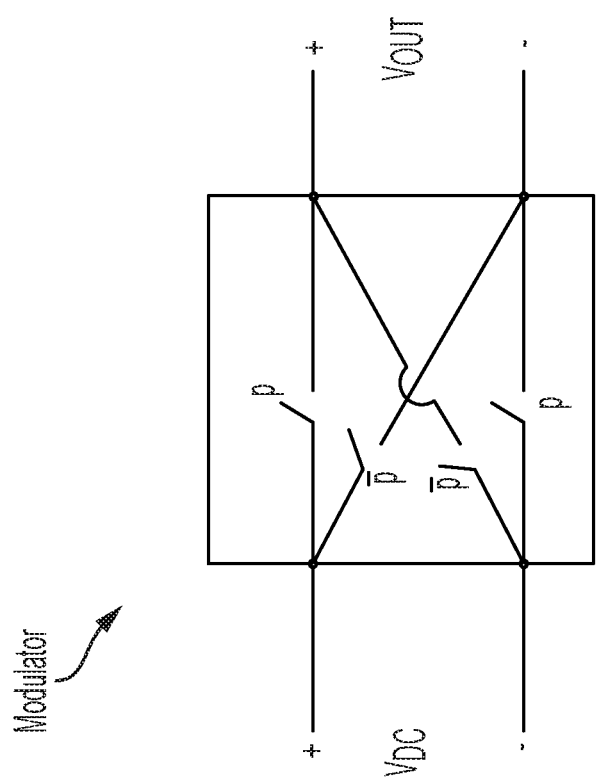
FIG. 9 is a circuit diagram illustrating exemplary modulation circuitry, in accordance with some embodiments of the technology described herein.

In some embodiments, modulation circuitry of measurement devices described herein may be configured for on-off modulation, as illustrated in the example of FIG. 9. The modulation circuitry of FIG. 9 includes multiple switches coupled between DC supply voltage $V_{DC}$ and modulated output voltage $V_{OUT}$. The switches are illustrated as being controlled by a signal p and its complement. For instance, p may be a binary waveform such as a square wave. Depending on the state of signal p, the modulated output voltage $V_{OUT}$ is either equal to $V_{DC}$ or to $-V_{DC}$. As a result, the modulation circuitry may mix $V_{DC}$ with carrier signal p to generate a square wave having high voltage $V_{DC}$ and low voltage $V_{DC}$ at a frequency of the carrier signal p.

Advantageously, $V_{DC}$ and carrier signal p may be generated digitally such that a DAC may not be necessary to apply the modulated output voltage $V_{OUT}$ to the DUT(s). Additionally, $V_{DC}$ may be large enough to apply to the DUT(s) without amplification, such that transmit amplification circuitry may not be necessary either. Accordingly, using the modulation circuitry illustrated in FIG. 9 may simplify construction of a measurement device, facilitating miniaturization of the device. Additionally, simplifying the modulation of the transmit signals correspondingly simplifies demodulation of received signals, as described further below. For example, while sinusoidal carrier signals may be noisy and cause distortion when generated imperfectly, using on-off modulation to selectively output various levels of DC voltage may not suffer from such adverse effects. Accordingly, it may be easier to demodulate signals transmitted using on-off square wave modulation due to having less distortion and an increased immunity to noise.

The modulation circuitry of FIG. 9 may also be configured to generate modulated transmit signals having programmable signal characteristics such as carrier frequency, resolution (e.g., number of digital bits used to generate the transmit signal), and average signal level.

In some embodiments, the modulation circuitry of FIG. 9 may include a butterfly switch. In some embodiments, the modulation circuitry may include a multiplexer configured to output one of two signals (e.g., DC voltage levels) depending on a carrier signal input (e.g., square wave) to a control terminal of the multiplexer. In some embodiments, the modulation circuitry may be configured to switch between two DC voltage levels A and B by multiplying a DC voltage level (A−B)/2 by a carrier signal (e.g., square wave) oscillating between voltages −1V and 1V and adding a second DC voltage level (A+B)/2.

Figure 10:
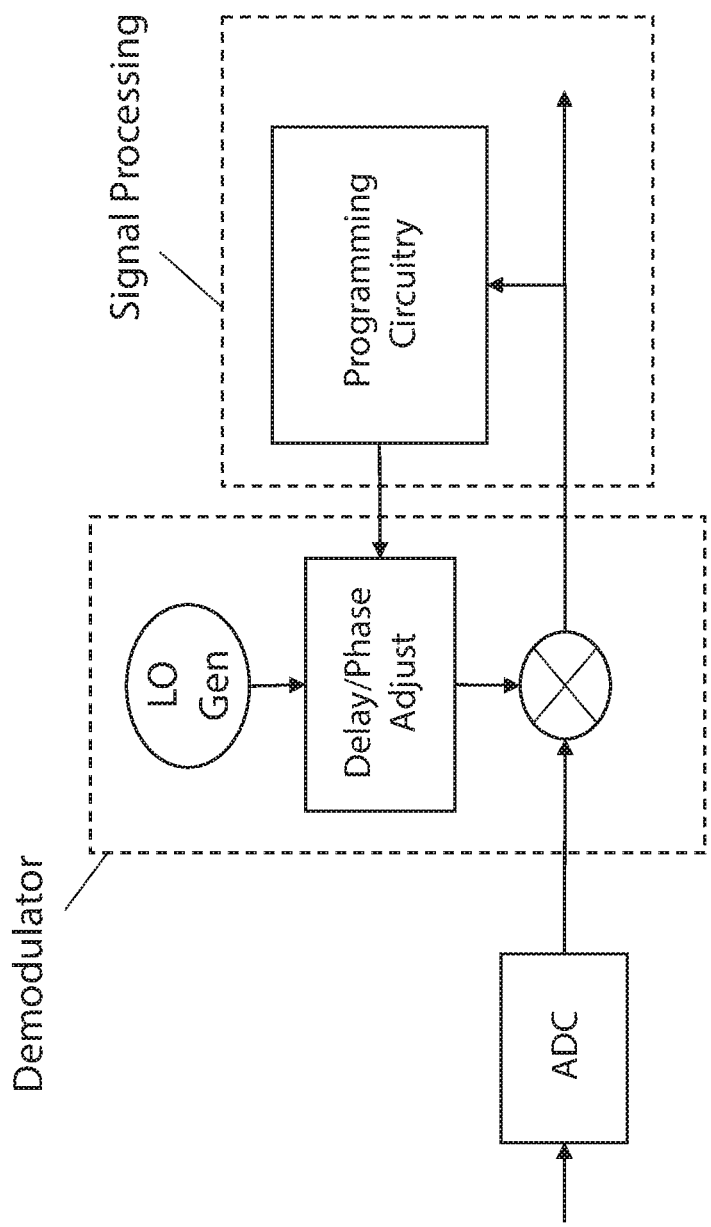
FIG. 10 is a circuit diagram illustrating exemplary demodulation circuitry, in accordance with some embodiments of the technology described herein.

In some embodiments, demodulation circuitry of measurement devices described herein may be programmable to facilitate extraction of a desired signal component from received signals, as illustrated in the example of FIG. 10. The demodulation circuitry of FIG. 10 is configured to down-convert a received signal to baseband such that the received signal may be analyzed using signal processing circuitry. However, the desired signal content in the received signals may be out of phase from the carrier signal used to demodulate the received signals. For example, a transmitted signal may undergo some phase change due to length of time and/or distance over which the transmitted signal travels before being received.

Some measurement devices resolve the change in phase between the carrier signal and the received signals using in-phase and quadrature demodulation followed by a sum of squares. However, the inventors observed that including in-phase and quadrature demodulation and sum of squares circuitry can require measurement devices to be large. For instance, the non-linear operation of summing squares may require high digital precision in order to prevent signal distortion due to noise in the received signals. Such precision may be achieved using an ADC having a large number of bits on the receive end. Including such an ADC may cause the measurement device to be too large to be contained in a single IC package.

The inventors developed techniques for extracting signal components from received signals that do not require measurement devices on which such techniques are implemented to be prohibitively large. In some embodiments, received signals may be demodulated using an oscillator signal having a programmable phase delay. For instance, using previously received signals, signal processing circuitry of the measurement device may be configured to program a phase delay into the demodulation circuitry such that the oscillator signal is appropriately delayed to extract a desired signal component from the received signal. In contrast to in-phase and quadrature demodulation, in which signal power could be allocated arbitrarily among the I and Q components, signal components extracted by measurement devices described herein may include a significant majority of the signal power of the received signals, such as 75%-90% or higher, with the discarded remaining portion of the received signals being almost entirely noise.

Figure 11:
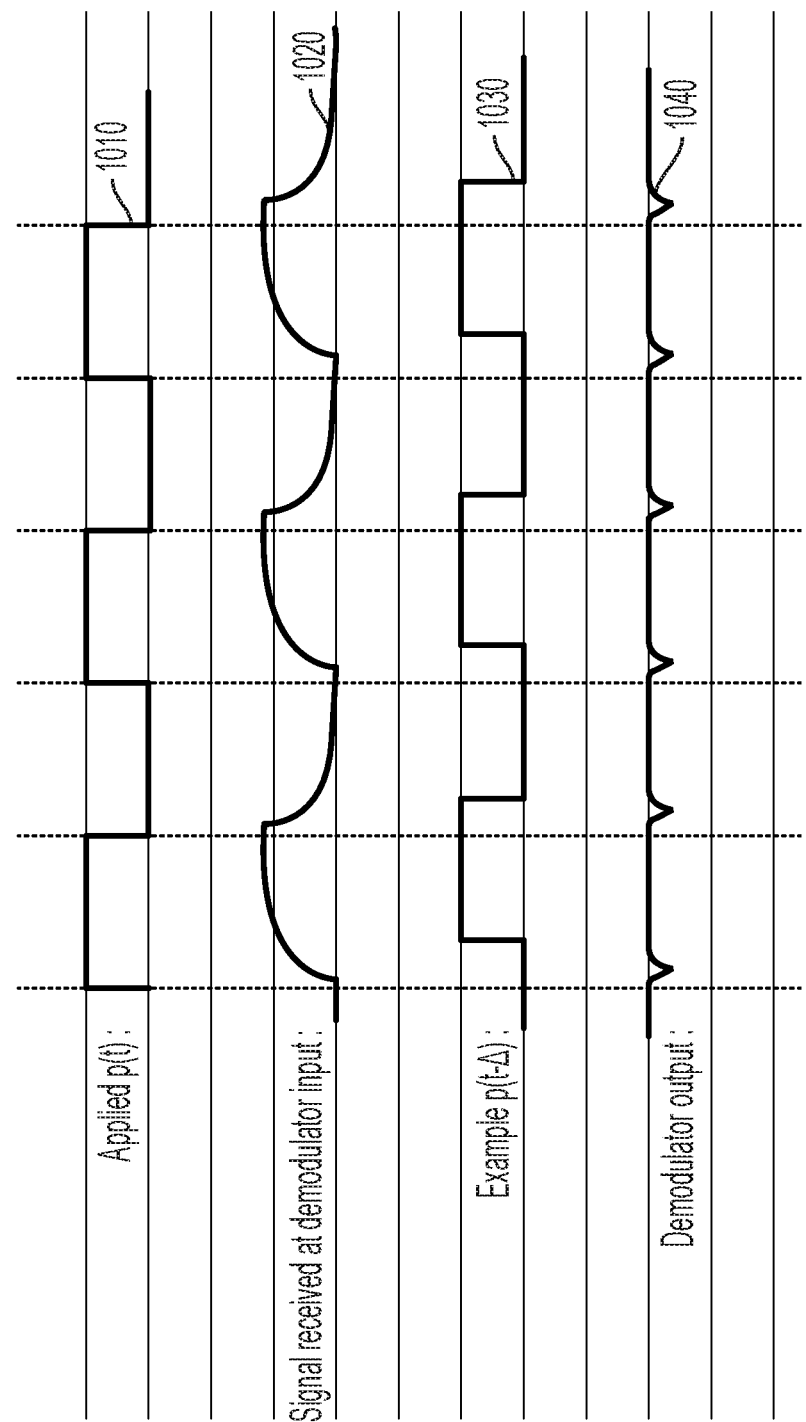
FIG. 11 is a time-graph plotting exemplary measurement device and DUT signals over time, in accordance with some embodiments of the technology described herein.

FIG. 11 is a graph demonstrating one embodiment of signal component extraction as described herein. The graph of FIG. 11 illustrates four signals 1110, 1120, 1130, and 1140. Signal 1110 is an exemplary carrier signal p(t), which may be applied to a baseband signal during modulation of a transmit signal, for example, in accordance with the embodiment illustrated in FIG. 9. Signal 1120 is an exemplary signal received from a DUT responsive to transmitting the carrier signal 1110 to the DUT. For instance, signal 1110 may be a voltage signal applied to a resistor, and signal 1120 may a voltage representation (e.g., generated using a TIA) of a current signal received from the resistor in response to applying signal 1110 to the resistor. Signal 1130 is an exemplary delayed carrier signal used to demodulate the received signal 1120. For instance, signal 1130 may be generated by applying a programmed phase delay to signal 1110. Signal 1140 is an exemplary demodulated signal that may be obtained by demodulating the received signal 1120 using the delayed carrier signal 1130. For example, as illustrated, the demodulated signal 1140 was obtained by multiplying the received signal 1120 by the delayed carrier signal 1130.

Figure 12:
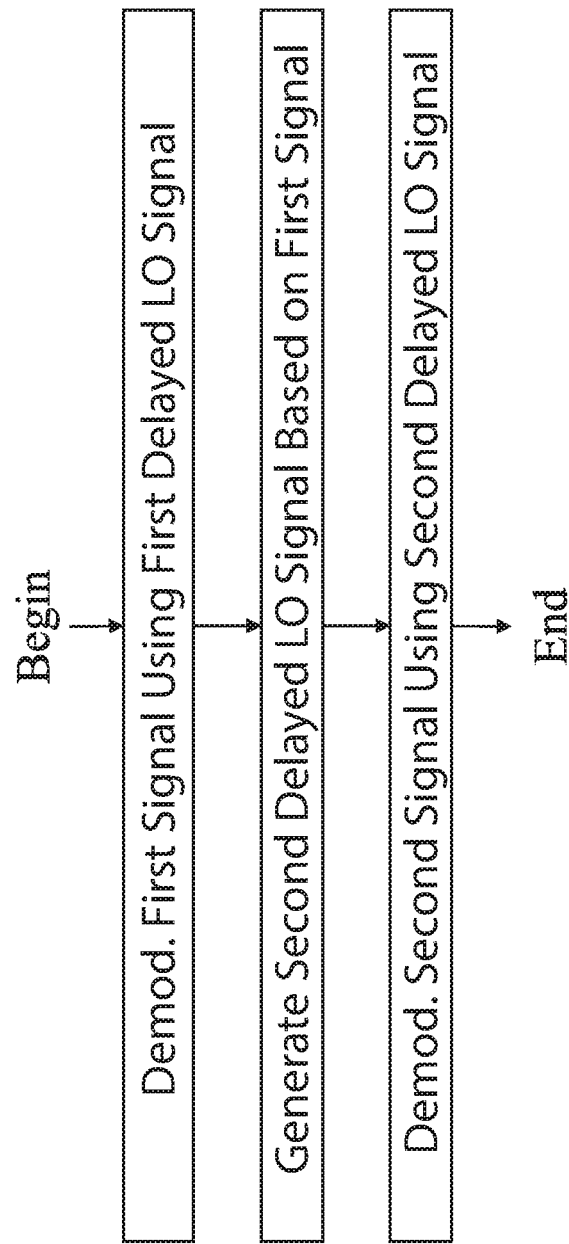
FIG. 12 is a flow diagram illustrating an exemplary method of programming a measurement device, in accordance with some embodiments of the technology described herein.

Some embodiments provide methods for programming a measurement device to apply a phase delay for demodulating received signals based on previously received signals. One such exemplary method is illustrated in FIG. 12. The method of FIG. 12 includes demodulating a first received signal (e.g., signal 1120 from FIG. 11) using an oscillator signal having a first delay (e.g., signal 1130 from FIG. 11), generating an oscillator signal having a second delay, and demodulating a second received signal using the oscillator signal having the second delay. For instance, the second delayed oscillator signal may be generated in response to receiving the first received signal. In some embodiments, the method of FIG. 12 may be performed using measurement devices described herein to program a phase delay for demodulating received signals. For example, the first and second signals may be received from one or more semiconductor nanowires as DUTs.

Demodulating the first signal may include using the oscillator signal having the first delay to down-convert the first signal to baseband. For example, using the demodulation circuitry illustrated in FIG. 10, the first signal may be multiplied by the delayed oscillator signal to generate a baseband signal. In some embodiments, the signal processing circuitry may determine whether to adjust the programmable delay applied to the oscillator signal based on the demodulated first signal. For example, the signal processing circuitry may determine whether the signal power in the demodulated signal has reached a maximum (e.g., local maximum). Some embodiments further include receiving additional signals before receiving the first signal, and the signal processing circuitry may compare the signal power in the demodulated first signal to the signal power of previously demodulated signals in determining whether to adjust the programmable delay.

Generating the oscillator signal having the second delay may include adjusting a programmable phase delay based on the received first signal. For example, the signal processing circuitry may determine that the first delay used to demodulate the first signal did not maximize the signal power of the demodulated signal. Accordingly, the signal processing circuitry may adjust the programmable phase delay in an iterative manner, continuing to search for phase delays that provide higher signal power following demodulation. Alternatively or additionally, in some embodiments, the signal processing circuitry may determine that a phase delay applied prior to receiving the first signal resulted in the demodulated signal having a higher signal power than the first signal. In some cases, the signal processing circuitry may determine that the previously applied phase delay corresponded to a local maximum in signal power, and the oscillator signal may be generated using the previously applied phase delay.

Demodulating the second signal may include down-converting the second signal using the oscillator signal generated in the previous step. In some embodiments, the signal processing circuitry may detect a signal power in the demodulated second signal and re-evaluate whether the first delay used to demodulate the first signal corresponded to the maximum signal power. For instance, if the second demodulated signal has lower signal power than the first demodulated signal, then the signal processing circuitry may program the delay used to demodulate the first signal and end the programming process. Alternatively, the signal processing circuitry may confirm that the second demodulated signal has higher signal power than the first demodulated signal, and program the delay used to demodulate the second signal and end the programming process. As a further alternative, the signal processing circuitry may determine that neither the first nor second phase delays maximize demodulated signal power, and so further signals may be received and demodulated using further adjusted delayed versions of the oscillator signals.

Figure 13:
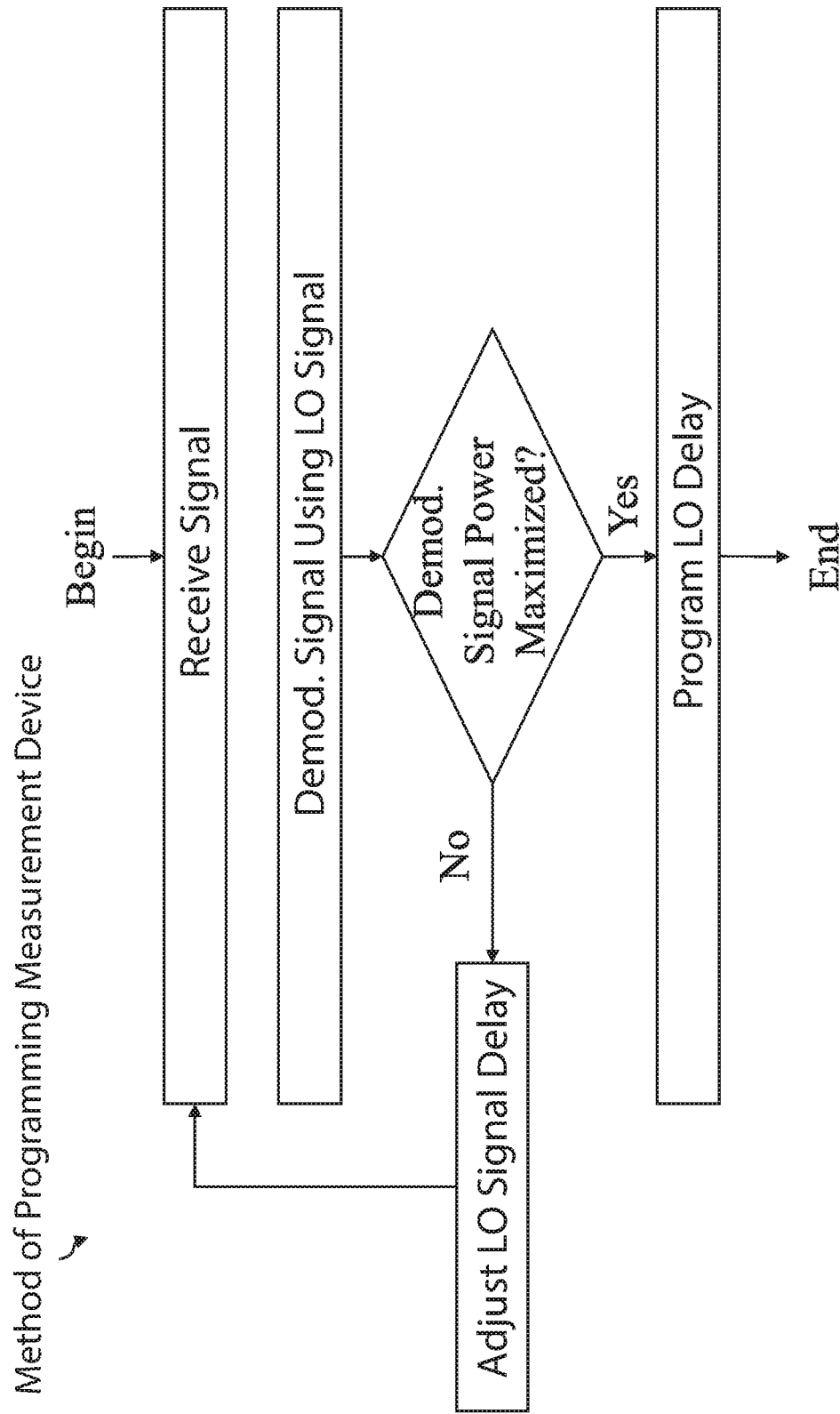
FIG. 13 is a flow diagram illustrating an exemplary method of programming a measurement device, in accordance with some embodiments of the technology described herein.

Some embodiments of the method of FIG. 12 may include an iterative programming process, as illustrated in the method of FIG. 13. The method of FIG. 13 includes receiving a signal, demodulating the signal using a delayed version of an oscillator signal, and determining whether the signal power of the demodulated signal is maximized. If the signal power is not maximized, the method adjusts the phase delay and starts over with another received signal. If signal power is maximized, the method programs the phase delay used to demodulate the received signal and ends the programming process.

In some embodiments, the methods of FIGS. 12-13 may be performed exactly once during operation of a measurement device described herein. In other embodiments, the methods may be performed multiple times during operation of the measurement device.

It should be appreciated that, in determining whether a programmable phase delay corresponds to maximum demodulated signal power, devices and methods described herein may not require that the demodulated signal power reach 100%. For instance, it is to be expected that at least some power will be contained in the portions of the received signal that are discarded as a result of demodulation (e.g., noise contained in portions that are not in phase with the delayed oscillator signal). In addition, the ability of a measurement device to maximize signal power depends on the precision of phase delay the device may achieve. For instance, with low enough precision in programming phase delay, the amount of phase delay required to obtain maximum demodulated signal power may not be achievable. In such a case, the phase delay corresponding to the local maximum demodulated signal power among programmable phase delay values may be used. On the other hand, with high enough precision in programming the phase delay, there may be several possible phase delays that result in substantially equal demodulated signal power (e.g., within 1% of one another). In the latter case, devices and methods described herein may program any phase delay that results in the maximum demodulated signal power.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, some aspects may be embodied as one or more methods, of which some examples are described herein in connection with FIGS. 12-13. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

What is claimed is:

1. A method of programming a measurement device, comprising:
   demodulating a first received signal from a device-under-test (DUT) using a first delayed version of an oscillator signal;
   generating a second delayed version of the oscillator signal based on demodulating the first received signal; and
   demodulating a second received signal from the DUT using the second delayed version of the oscillator signal,
   wherein:
   the DUT includes at least one semiconductor nanowire;
   demodulating the first received signal includes mixing the first received signal with the first delayed version of the oscillator signal to generate a first baseband signal; and
   generating the second delayed version of the oscillator signal includes determining a second delay based on the first baseband signal.

2. The method of claim 1, wherein generating the second delayed version of the oscillator signal further includes:
   programming the second delay into a programmable delay unit; and
   applying, by the programmable delay unit, the second delay to the oscillator signal.

3. The method of claim 1, further comprising:
   prior to demodulating the first received signal, demodulating a third received signal using a third delayed version of the oscillator signal to generate a second baseband signal,
   wherein determining the second delay includes determining whether the first baseband signal has a greater signal power than the second baseband signal.

4. The method of claim 1, further comprising;
   modulating a transmit signal using the oscillator signal to generate a modulated transmit signal; and
   transmitting the modulated transmit signal to the semiconductor nanowire.

5. A measurement device, comprising:
   demodulation circuitry configured to use an oscillator signal to extract a component of a received signal from at least one semiconductor nanowire, wherein the component is in-phase with the oscillator signal; and
   processing circuitry configured to detect an electrical characteristic of the at least one semiconductor nanowire using the component.

6. The measurement device of claim 5, wherein the electrical characteristic includes a conductance of the at least one semiconductor nanowire.

* * * * *